(12) United States Patent
Kuo et al.

(10) Patent No.: US 10,367,169 B2
(45) Date of Patent: Jul. 30, 2019

(54) PROCESSES FOR MAKING LIGHT EXTRACTION SUBSTRATES FOR AN ORGANIC LIGHT EMITTING DIODE USING PHOTO-THERMAL TREATMENT

(71) Applicant: CORNING INCORPORATED, Corning, NY (US)

(72) Inventors: Kuan-Ting Kuo, Hsinchu (TW); Jen-Chieh Lin, Zhubei (TW); Lu Zhang, Taipei (TW)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 15/784,676

(22) Filed: Oct. 16, 2017

(65) Prior Publication Data
US 2018/0108868 A1 Apr. 19, 2018

Related U.S. Application Data

(60) Provisional application No. 62/409,070, filed on Oct. 17, 2016.

(51) Int. Cl.
*H01L 51/52* (2006.01)
*H01L 51/00* (2006.01)
*H01L 51/56* (2006.01)
*B05D 3/06* (2006.01)

(52) U.S. Cl.
CPC ...... *H01L 51/5262* (2013.01); *H01L 51/0097* (2013.01); *H01L 51/5268* (2013.01); *H01L 51/56* (2013.01); *B05D 3/067* (2013.01); *H01L 2251/303* (2013.01);
(Continued)

(58) Field of Classification Search
CPC . H01L 51/52; H01L 51/5262; H01L 51/5268; H01L 51/0097
See application file for complete search history.

(56) References Cited

U.S. PATENT DOCUMENTS

| | | | |
|---|---|---|---|
| 2012/0091488 A1* | 4/2012 | Vermersch | C03C 17/007 257/98 |
| 2012/0261701 A1* | 10/2012 | Yoo | H01L 51/5275 257/98 |
| 2013/0043221 A1 | 2/2013 | Hataway et al. | |

(Continued)

FOREIGN PATENT DOCUMENTS

| | | |
|---|---|---|
| KR | 1359663 B1 | 2/2014 |
| WO | 2014046536 A1 | 3/2014 |

OTHER PUBLICATIONS

Hwang et al; "Ultra-High Speed Fabrication of TiO2 Photoanode by Flash Light for Dye-Sensitized Solar Cell"; Journal of Nanoscience and Nanotechnology; vol. 15, No. 7, pp. 5028-5034 (2015).

(Continued)

*Primary Examiner* — Phuc T Dang

(57) ABSTRACT

A process includes providing a base substrate and disposing a precursor on the base substrate. The precursor includes powdered particles of a first material and an organic binder. The process includes photo-thermally treating the precursor to form a light extraction layer. The photo-thermal treatment includes exposing the precursor to a flash lamp that is energized in pulses. The process further includes disposing an organic light emitting diode adjacent to the light extraction layer.

35 Claims, 12 Drawing Sheets

(52) U.S. Cl.
CPC ............... *H01L 2251/5338* (2013.01); *H01L 2251/5369* (2013.01); *Y02E 10/549* (2013.01)

(56) References Cited

U.S. PATENT DOCUMENTS

| | | | |
|---|---|---|---|
| 2013/0119423 A1* | 5/2013 | Lee | ............... H01L 33/58 257/98 |
| 2014/0333916 A1 | 11/2014 | Bessonov | |
| 2015/0177620 A1 | 6/2015 | Ohta | |
| 2015/0181714 A1 | 6/2015 | Ahmed et al. | |
| 2016/0372710 A1 | 12/2016 | Iwase et al. | |
| 2017/0084669 A1* | 3/2017 | Wolk | ............... H01L 51/5268 |

OTHER PUBLICATIONS

International Search Report and Written Opinion PCT/US2017/056880 dated Jan. 19, 2018.

* cited by examiner

PROCESSES FOR MAKING LIGHT EXTRACTION SUBSTRATES FOR AN ORGANIC LIGHT EMITTING DIODE USING PHOTO-THERMAL TREATMENT

This application claims the benefit of priority under 35 U.S.C. § 119 of U.S. Provisional Application Ser. No. 62/409,070, filed on Oct. 17, 2016, the content of which is relied upon and incorporated herein by reference in its entirety.

FIELD

The present disclosure relates to processes for making light extraction substrates for an organic light emitting diode (OLED) and products including such light extraction substrates. More specifically, the processes include photo-thermal treatment of a substrate precursor using high energy light source.

BACKGROUND

An OLED is a light-emitting element that generates light using energy emitted from excitations created by the recombination of electrons injected through a cathode and holes injected through an anode. OLEDs have a variety of advantages, such as low-voltage driving, self-emission, a wide viewing angle, high resolution, natural color reproducibility, and short response times. OLED lighting is also advantageous because it is a diffusive light source that minimizes glare. OLEDs generate less heat as compared with a traditional light emitting diode (LED), which saves power and material usage.

OLEDs may be applied to a variety of devices, such as portable information devices, cameras, watches, office equipment, information display windows of vehicles, televisions (TVs), display devices, illumination devices, and other electronic devices.

One challenge for OLED lighting is light efficiency loss, generally caused by a difference of refractive index between layers that results in light scattering or reflection within the device, or by light absorption within a layer. To improve the efficiency, one or more light extraction substrates may be used in an OLED device. A large number of different types of light extraction layers have been designed for use in OLEDs as well as other applications. Examples of light extraction substrates include those described in Korean Patent Application No. 2016-034791A, filed Mar. 23, 2016, which is incorporated by reference herein in its entirety.

The light extraction substrates described in Korean Patent Application No. 2016-034791A can be formed by providing one or more precursors on a base substrate and thermally treating each respective precursor layer in a specialized oven. Thermal treating typically requires temperatures up to 500° C. for a duration lasting 15 to 30 minutes or more for each individual layer. This process is time consuming, which increases manufacturing costs. Further, the high temperatures required for thermal treating are unsuitable for some base substrate materials. Therefore, a more rapid process that reduces the required treating temperature is needed for forming light extraction substrates for OLEDs.

BRIEF SUMMARY

The present disclosure is directed to processes that can be used to make light extraction substrates configured to receive an organic light emitting diode thereon. In some embodiments, the process can include providing a base substrate and disposing a precursor on the base substrate. The precursor can include powdered particles of a first material and an organic binder. The process can include photo-thermally treating the precursor, which in some embodiments can form a light extraction layer. In some embodiments, the process can include disposing an organic light emitting diode adjacent to the light extraction layer.

In an aspect (1), the disclosure provides an article having a light output, the article comprising: a light generation layer; a base substrate having a first surface, a second surface, and at least one edge surface; a porous photo-thermally treated light extraction layer adjacent to the first surface of the base substrate and between the base substrate and the light generation layer, the porous photo-thermally treated light extraction layer having an average pore diameter from 10 nm to 1000 nm, and comprising particles of an inorganic oxide, the particles having an average diameter of from 10 nm to 1 µm; and wherein the porous photo-thermally treated light extraction layer improves the light output of the article by a factor of 1.7× or greater. In an aspect (2), the disclosure provides the article of aspect (1), wherein the porous photo-thermally treated light extraction layer improves light output by 2× or greater. In an aspect (3), the disclosure provides the article of aspect (1) or aspect (2), further comprising a smoothing layer comprising an inorganic polymer adjacent to the photo-thermally treated light extraction layer. In an aspect (4), the disclosure provides the article of aspect (3), wherein the inorganic polymer comprises a siloxane. In an aspect (5), the disclosure provides the article of aspect (4), wherein the siloxane has a refractive index of from 1.3 to 1.5. In an aspect (6), the disclosure provides the article of any of aspects (1)-(5), wherein the inorganic oxide comprises $TiO_2$. In an aspect (7), the disclosure provides the article of aspect (6), wherein the $TiO_2$ comprises rutile. In an aspect (8), the disclosure provides the article of any of aspects (1)-(7), wherein the light extraction layer comprises a second inorganic oxide comprising $SiO_2$, ZnO, $SnO_2$, or combinations thereof. In an aspect (9), the disclosure provides the article of any of aspects (1)-(8), wherein the light generation layer comprises an OLED stack adjacent to the photo-thermally treated light extraction layer, and wherein when present, the smoothing layer is located between the photo-thermally treated light extraction layer and the OLED stack. In an aspect (10), the disclosure provides the article of any of aspects (1)-(9), further comprising at least one modification to the second surface of the base substrate, wherein the modification further improves the light output of the article by a factor of 20% or more. In an aspect (11), the disclosure provides the article of aspect (10), wherein the at least one modification comprises a nanoparticle coating, a film, or etching the second surface of the base substrate.

In an aspect (12), the disclosure provides a process for forming an article for improved light extraction, the process comprising: providing a base substrate; disposing a precursor on the base substrate, the precursor comprising: particles of a first material comprising an inorganic oxide and having: an average diameter of from 10 nm to 1 µm; and an organic binder; and photo-thermally treating the precursor to form a porous photo-thermally treated light extraction layer having an average pore diameter from 10 nm to 1000 nm, wherein the photo-sintering comprises exposing the precursor to a radiation source emitting radiation in at least the range from 300 to 400 nm and the porous photo-thermally treated light extraction layer improves the light output of the article by a factor of 1.7× or greater. In an aspect (13), the disclosure provides the process of aspect (12), wherein the process further comprises coating the light extraction layer with a second layer comprising an inorganic polymer. In an aspect (14), the disclosure provides the process of aspect (13), wherein the method further comprises disposing an organic light emitting diode adjacent to the inorganic polymer. In an aspect (15), the disclosure provides the process of aspect (13) or aspect (14), further comprising disposing a light generation layer adjacent to the light extraction layer. In an aspect (16), the disclosure provides the process of aspect (15), wherein disposing the light generation layer adjacent to the light extraction layer comprises fabricating the organic light emitting diode on the planarization layer. In an aspect (17), the disclosure provides the process of any of aspects (12)-(16), wherein the radiation source comprises a pulsed radiation source having a pulse width of from 1 µs to 100 ms measured at ⅓ peak value. In an aspect (18), the disclosure provides the process of aspect (17), wherein the energy per pulse is from 1 to 5000 J. In an aspect (19), the disclosure provides the process of aspect (17) or aspect (18), wherein the energy per pulse delivered to the material is from 0.01 to 1 J/cm$^2$/pulse. In an aspect (20), the disclosure provides the process of any of aspects (17)-(19), wherein the total energy delivered to the material is from 0.1 to 100 J/cm$^2$. In an aspect (21), the disclosure provides the process of any of aspects (17)-(20), wherein pulses from the pulsed radiation source comprise at least two different stages, wherein each stage comprises a pulse energy and pulse duration. In an aspect (22), the disclosure provides the process of aspect (21), wherein the pulses comprise at least two different stages, a first stage comprising an initial part of the pulse and a second stage, comprising a subsequent part of the pulse. In an aspect (23), the disclosure provides the process of aspect (22), wherein the first stage has an energy/pulse of 100-5000 J/pulse and a duration from 0.1 ms to 10 ms. In an aspect (24), the disclosure provides the process of aspect (22) or aspect (23), wherein the second stage has an energy/pulse of 100-5000 J/pulse and a duration from 0.1 ms to 10 ms. In an aspect (25), the disclosure provides the process of any of aspects (22)-(24), wherein the first stage has a duration of from 100 ms to 300 ms and the second stage has a duration of from 1000 ms to 3000 ms. In an aspect (26), the disclosure provides the process of any of aspects (12)-(25), wherein the first stage has a total energy delivered to the material from 0.1 to 100 J/cm$^2$. In an aspect (27), the disclosure provides the process of aspect (26), wherein the first stage has a peak energy that is 1.5 to 10× higher than the peak energy of the second stage. In an aspect (28), the disclosure provides the process of any of aspects (22)-(27), wherein the ratio of total energy delivered to the material in the first stage/second stage is from 1-4. In an aspect (29), the disclosure provides the process of any of aspects (22)-(28), wherein the process further comprises a starter pulse that has an energy/pulse of 2-10× the energy/pulse value of the first stage pulse. In an aspect (30), the disclosure provides the process of any of aspects (12)-(29), wherein the overall duration of the photo-thermal treatment is from 20 seconds to 10 minutes. In an aspect (31), the disclosure provides the process of aspect (30), wherein the duration of the photo-thermal treatment is 1 minute to 4 minutes. In an aspect (32), the disclosure provides the process of any of aspects (12)-(31), wherein a maximum temperature during the photo-thermal treatment is 150° C. or less. In an aspect (33), the disclosure provides the process of any of aspects (12)-(32), wherein the particles of the first material comprise TiO$_2$.

In an aspect (34), the disclosure provides a process for forming an article for improved light extraction, the process comprising: providing a base substrate; disposing a two-layer precursor on the base substrate, the two-layer precursor comprising: a first layer adjacent to the base substrate, the first layer comprising: an inorganic oxide having an average diameter from 10 nm to 1 µm, and an organic binder; and a second layer adjacent to the first layer, the second layer comprising: an inorganic polymer smoothing layer; wherein the first layer and second layer are substantially unmixed; and acting on the two-layer precursor to form a light extraction layer having an average pore diameter from 10 nm to 1000 nm; wherein acting comprises photo-thermally treating at least one layer of the two-layer precursor; and wherein: the photo-thermally treating comprises exposing the precursor to a radiation source emitting radiation in at least the range from 300 to 400 nm, and the porous photo-thermally treated light extraction layer improves the light output of the article by a factor of 1.7× or greater. In an aspect (35), the disclosure provides the process of aspect (34), further comprising disposing a light generation layer adjacent to the second layer. In an aspect (36), the disclosure provides the process of aspect (35), wherein disposing the light generation layer adjacent to the light extraction layer comprises fabricating the organic light emitting diode on the planarization layer. In an aspect (37), the disclosure provides the process of any of aspects (34)-(36), wherein the radiation source comprises a pulsed radiation source having a pulse width of from 1 µs to 100 ms measured at ⅓ peak value. In an aspect (38), the disclosure provides the process of aspect (37), wherein the energy per pulse is from 1 to 5000 J. In an aspect (39), the disclosure provides the process of aspect (37) or aspect (38), wherein the energy per pulse delivered to the material is from 0.01 to 1 J/cm$^2$/pulse. In an aspect (40), the disclosure provides the process of any of aspects (37)-(39), wherein the total energy delivered to the material is from 0.1 to 100 J/cm$^2$. In an aspect (41), the disclosure provides the process of any of aspects (37)-(40), wherein pulses from the pulsed radiation source comprise at least two different stages, wherein each stage comprises a pulse energy and pulse duration. In an aspect (42), the disclosure provides the process of aspect (41), wherein the pulses comprise at least two different stages, a first stage comprising an initial part of the pulse and a second stage, comprising a subsequent part of the pulse. In an aspect (43), the disclosure provides the process of aspect (42), wherein the first stage has an energy/pulse of 100-5000 J/pulse and a duration from 0.1 ms to 10 ms. In an aspect (44), the disclosure provides the process of aspect (42) or aspect (43), wherein the second stage has an energy/pulse of 100-5000 J/pulse and a duration from 0.1 ms to 10 ms. In an aspect (45), the disclosure provides the process of any of aspects (42)-(44), wherein the first stage has a duration of from 100 ms to 300 ms and the second stage has a duration of from 1000 ms to 3000 ms. In an aspect (46), the disclosure provides the process of any of aspects (42)-(45), wherein the first stage has a total energy delivered to the material from 0.1 to 100 J/cm$^2$. In an aspect (47), the disclosure provides the process of aspect (46), wherein the first stage has a peak energy that is 1.5 to 10× higher than the peak energy of the second stage. In an aspect (48), the disclosure provides the process of any of aspects (42)-(47), wherein the ratio of total energy delivered to the material in the first stage/second stage is from 1-4. In an aspect (49), the disclosure provides the process of any of aspects (42)-(48), wherein the process further comprises a starter pulse that has an energy/pulse of 2-10× the energy/pulse value of the first stage pulse. In an aspect (50), the disclosure provides the process of any of aspects (34)-(49), wherein the overall duration of the photo-thermal treatment is from 20 seconds to 10 minutes. In an aspect (51), the disclosure provides the process of aspect (50), wherein the overall duration of the photo-thermal treatment is 1 minute to 4 minutes. In an aspect (52), the disclosure provides the process of any of aspects (34)-(51), wherein a maximum temperature during the photo-thermal treatment is 150° C. or less. In an aspect (53), the disclosure provides the process of any of aspects (34)-(52), wherein the particles of the inorganic oxide comprise $TiO_2$.

In an aspect (54), the disclosure provides the process of any of aspects (12)-(53), wherein such processes can be applied to the base substrate via a continuous roll-to-roll processing. In such embodiments, the substrate can be a continuous roll of a flexible substrate, such as a polymer or ultra-thin glass. In an aspect (55), completion of photo-thermal treatment steps of any of the aspect herein can occur after additional layers have been deposited or patterned such as ITO. In some embodiments, the photo-thermal treatment process can additionally be used to anneal the ITO layer.

In another aspect, the photo-thermal treatment exposure can be combined with a thermal heating step in which case the photonic effects are in addition to any effects created by the thermal baseline process.

In an aspect (55), the disclosure provides the process of any of aspects (12)-(54), wherein more than 90% of the organic binder can be burned off during the photo-thermal treatment. In some embodiments, thermal gravimetric analysis measured up to 500° C., performed after photo-thermal treatment, detects a mass change less than 8%.

In an aspect (56), the disclosure provides the process of any of aspects (12)-(55), wherein a maximum temperature during the photo-thermal treatment can be 160° C. or less. In some embodiments, a maximum temperature during the photo-thermal treatment can be 150° C. or less. In some embodiments, a maximum temperature during the photo-thermal treatment can be 140° C. or less. In some embodiments, the light source comprises a Xe flash lamp. In some embodiments, the flash lamp can be disposed 40 mm to 60 mm from the precursor during photo-thermal treatment. In some embodiments, the UV lamp can be disposed 50 mm from the precursor during photo-thermal treatment.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

DETAILED DESCRIPTION

Figure 1:
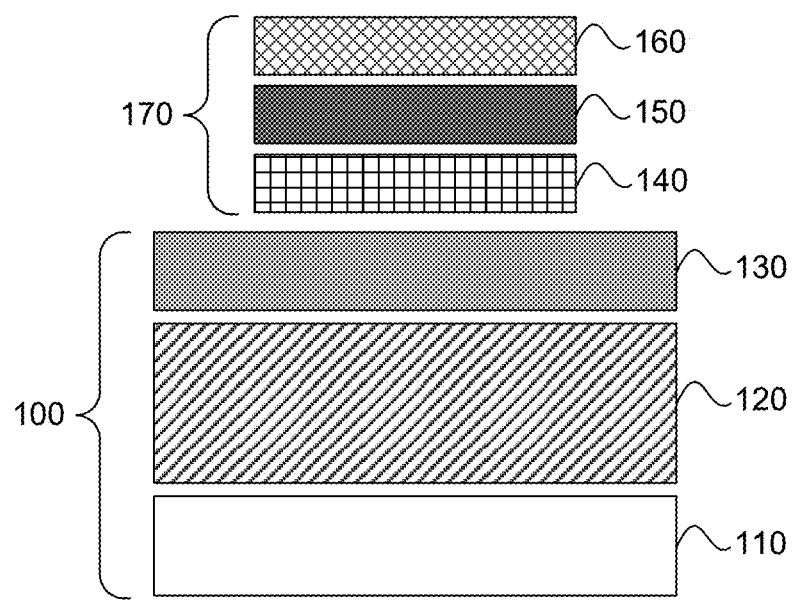
FIG. 1 illustrates a light extraction substrate and an OLED, according to an embodiment.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. When a numerical value or end-point of a range does not recite "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The term "or," as used herein, is inclusive; more specifically, the phrase "A or B" means "A, B, or both A and B." Exclusive "or" is designated herein by terms such as "either A or B" and "one of A or B," for example.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

The term "wherein" is used as an open-ended transitional phrase, to introduce a recitation of a series of characteristics of the structure.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

FIG. 1 illustrates an example of a light extraction substrate 100, according to an embodiment. It will be understood by those of skill in the art that the processes described herein can be applied to other configurations of light extraction substrates, for example, the light extraction substrates disclosed in Korean Patent Application No. 2016-034791A, which is incorporated by reference herein in its entirety.

In an embodiment, light extraction substrate 100 can include a base substrate 110 and a light extraction layer 120 disposed on the base substrate 110. In some embodiments, light extraction substrate 100 can include a planarization layer 130. In some embodiments, planarization layer 130 can be disposed directly adjacent to light extraction layer 120. As used here, "directly adjacent" means that at least a portion of two components are in direct physical contact wither each other. Other layers can be disposed on, between, or adjacent to base substrate 110, light extraction layer 120, and/or planarization layer 130. Additionally, layers can exist on a single surface of base substrate 110 as shown in FIG. 1, or substrate 110 can have layers existing on both surfaces. These additional layers can be organic or inorganic materials. These layers applied to the surfaces of base substrate 110 do not need to be continuous across the entire surface. They can also be patterned or selectively located.

The base substrate 110 comprises a first, roughly planar surface, a second roughly planar surface and at least one edge. In general, the first and second roughly planar surfaces are parallel to each other. Base substrate 110 can serve as a foundation upon which to build light extraction substrate 100 and can provide support to light extraction layer 120, planarization layer 130, and any other layer disposed thereon. In addition, base substrate 110 can serve as an encapsulation layer that is disposed on a path along which light generated by an OLED is emitted to allow the generated light to exit therethrough while protecting the OLED from the external environment.

Any transparent substrate that has suitable light transmittance and mechanical properties can be used as the base substrate 110, including glasses, glass ceramics, organic polymeric materials, and ceramics. For example, in some embodiments, the base substrate 110 may be formed from a polymeric material, for example, a heat or ultraviolet (UV) curable organic film. In some embodiments, a chemically strengthened glass substrate formed from, for example, soda-lime glass ($SiO_2$—CaO—$Na_2O$) or aluminosilicate glass ($SiO_2$—$Al_2O_3$—$Na_2O$)) may be used as the base substrate 110. In some embodiments, a substrate formed from a metal oxide or a metal nitride may be used as the base substrate 110. A flexible substrate, for example, a thin glass substrate having a thickness of 1.5 mm or less can be used as the base substrate 110. As an example, the substrate can have a thickness of 0.5 mm, 0.4 mm, 0.3 mm, 0.2 mm, 0.1 mm, or 0.05 mm or any value in between. Additionally, the base substrate 110 can be made of multiple planar layers of similar or different materials.

In a typical OLED without a light extraction layer, only about 20% of the light generated by the organic light emitting layer(s) is emitted from the device. The remainder of the light is either absorbed or reflected. A light extraction layer, such as light extraction layer 120, can scatter light generated by an OLED. This scattering can change the direction of photons, so that a photon that would have been absorbed or reflected in the absence of a light extraction layer is instead emitted, thereby improving light extraction efficiency of the OLED device. This scattering can be caused, for example, by light extraction layer 120 having a rough interface, or by particles, interfaces, or pores within light extraction layer 120.

Aspects described herein improve the light output by a factor of 1.2, 1.5, 1.7, 2.0 or greater.

In some embodiments, light extraction layer 120 can be formed on the base substrate 110. In an embodiment, when the light extraction substrate 100 is coupled with an OLED 170, the light extraction layer 120 is disposed between the OLED 170 and the base substrate 110. In such an embodiment, the light pathway is first through the light extraction layer 120 and then through the base substrate 110. In addition, the light extraction layer or OLED may be formed on a substrate that already has additional materials or patterned features on it.

In some embodiments, light extraction layer 120 comprises an inorganic oxide, metal oxide, or metalloid oxide. In some embodiments, the light extraction layer 120 can comprise an inorganic oxide, metal oxide, or metalloid oxide having a refractive index of from 1.2 to 2.0. In some embodiments, the light extraction layer 120 has a refractive index of 1.2, 1.3, 1.4, 1.5, 1.6, 1.7, 1.8, 1.9, or 2.0, or any range in between these values. In some embodiments, the light extraction layer has a refractive index that is within ±0.7, ±0.6, ±0.5, ±0.4, ±0.3, ±0.25, ±0.2, ±0.15, ±0.1, or ±0.05, of the refractive index of the substrate. In some embodiments, the light extraction layer has a refractive index that is within AAA of the refractive index of the planarizing layer 130. In some embodiments, the light extraction layer has a refractive index that is within ±0.7, ±0.6, ±0.5, ±0.4, ±0.3, ±0.25, ±0.2, ±0.15, ±0.1, or ±0.05, of the refractive index of the first electrode 140 or the OLED 170.

The oxide material may be in the form of particles, such as nano- or microparticles. For example, the particles may have an average diameter along their longest axis of from 10 nm to 1 μm as measured using standard techniques (for example, laser diffraction, dynamic light scattering, or image analysis). For example, light extraction layer 120 can comprise $TiO_2$ (i.e. titania). In some embodiments, the $TiO_2$ is in the form of rutile, or in a tetragonal crystal symmetry. In some embodiments, light extraction layer 120 comprises a porous $TiO_2$ layer. For example, light extraction layer 120 can have pores with a diameter of 10 nm to 1000 nm. In some embodiments, light extraction layer 120 comprises rutile $TiO_2$, having an index of refraction of n~2.6.

A thickness of the light extraction layer 120 can range from 0.4 μm to 5 μm. In some embodiments, light extraction layer 120 can have a thickness of 0.5 μm to 2 μm. In some embodiments, light extraction layer 120 can have a thickness of 0.8-1.7 μm.

In some embodiments, one or more metal oxides, such as $SiO_2$, $TiO_2$, ZnO, $SnO_2$, or combinations thereof can be used for light extraction layer 120. Other inorganic and/or organic materials can also be used. In some embodiments, light extraction layer 120 can have a composition as described in Korean Patent Application No. 2016-034791A, which is incorporated by reference herein in its entirety.

In some embodiments, planarization layer 130 can be disposed on light extraction layer 120. In some embodiments, the planarization layer 130 can also be disposed directly adjacent to an OLED 170, and more particularly, the anode (e.g., 140) of the OLED 170. Because the planarization layer 130 can abut the anode of the OLED 170, the surface of the planarization layer 130 should have a high degree of flatness, as measured by atomic force microscopy, to prevent the electrical characteristics of the OLED 170 from being degraded. Thus, the planarization layer 130 should have a thickness sufficient to smooth out surface roughness of the light extraction layer 120. In some embodiments, a thickness of the planarization layer 130 can range from 0.1 µm to 5 µm. In some embodiments, a thickness of the planarization layer 130 can range from 0.5 µm to 1 µm. In some embodiments, the thickness of the planarization layer 130 can be 0.7 µm.

The planarization layer 130 can be formed from an organic material, an inorganic material, or a hybrid material of organic and inorganic materials. In some embodiments, the planarization layer comprises multiple layers of the same or different materials. In some embodiments, a siloxane, for example, PDMS (polydimethylsiloxane) having a refractive index of n=1.3-1.5, may be used. In some embodiments, the planarization layer 130 can be formed from a metal oxide, such as MgO, $Al_2O_3$, $ZrO_2$, $SnO_2$, ZnO, $SiO_2$ or $TiO_2$, or combinations thereof. In some embodiments, planarization layer 130 can have a composition as described in Korean Patent Application No. 2016-034791A, which is incorporated by reference herein in its entirety.

In some embodiments, the light extraction substrate 100 further comprises an external light extraction layer or other material layer on surface of the base substrate 110 distal or opposite to the light extraction layer 120. This layer on the opposite side of the substrate can be patterned or continuous. Such an external light extraction layer may comprise a film, particles, or modifications to the base substrate 110. Examples of external light extraction layers include an etched surface on the base substrate 110, a nanoparticle coating of high index particles optionally in a low index matrix or a matrix index matched to the base substrate 110, a polymer film comprising light extraction features, etc.

As also shown in FIG. 1, in some embodiments, an OLED 170 can be disposed on light extraction substrate 100. In some embodiments, OLED 170 can be disposed on planarization layer 130. OLED 170 could also be disposed on light extraction layer 120. In some embodiments a plurality of OLEDs can be disposed on light extraction substrate 100. These can be disposed horizontally in relation to each other or vertically.

OLEDs are well-known in the art, and any appropriate OLED structure may be used. For example, OLED 170 can include a first electrode 140 and a second electrode 160. First electrode 140 can be the anode and second electrode 160 can be the cathode, or vice versa. In some embodiments, first electrode 140 can be transparent, and can be made of indium tin oxide (ITO) or other transparent electrode materials. Second electrode 160 can be transparent or reflective, such as a gold, silver, copper, or aluminum layer.

Organic layer 150 can be disposed between first electrode 140 and second electrode 160. When a voltage is applied between first electrode 140 and second electrode 160, organic layer 150 emits light. Organic layer 150 can include a plurality of sub-layers, and a subset of those sub-layers may emit light.

As discussed above, light extraction substrates are typically formed by a thermal process using an oven. By way of example, Table 1 below shows an example of typical thermal process requirements for layers of a light extraction substrate.

TABLE 1

| | Materials | Wet thickness (µm) | Drying Temp (C.)/time (sec) | Sintering Temp (C.)/time (min) | Requirement |
|---|---|---|---|---|---|
| Layer 1 | $SiO_2$ in $TiO_2$ | 8 | 150° C./30 sec | 500° C./30 min | Haze - 60-80%<br>T (%) - 60-80% (haze meter)<br>Variation <10% |
| Layer 2 | $TiO_2$ | 9 | 150° C./30 sec | 200° C./30 min | Thickness: ~0.8 um<br>Variation <10% |
| Layer 3 | Siloxane | 13.5 | 120° C./30 sec | 230° C./5 min | Thickness: ~1 um<br>Roughness <100 nm<br>Variation <10% |

In the example shown in Table 1, Layer 1 can include $SiO_2$ particles (silica) in a $TiO_2$ matrix, Layer 2 can be a layer of $TiO_2$, and Layer 3 can be an organic or inorganic planarization layer (e.g. a siloxane). All three layers have absorption in UV range. With this high index matrix and the index difference between $SiO_2$ and $TiO_2$, more light can be scattered and extracted by the light extraction substrate. To make these stack layers, three coating solutions can be applied on a glass substrate (e.g., 0.1 mm Comine Willow® Glass or 0.5-0.7 mm Corning® EAGLE'® Glass), first by a slot-die coating process followed by drying and thermal process steps. As discussed above, some embodiments of the light extraction substrates disclosed herein include only the equivalent of Layer 2 (a light extraction layer) and Layer 3 (a planarization layer). The layers applied to base substrate 110 can be formed in continuous roll-to-roll processing or can be formed using processes optimized for discrete sheets. In addition to slot-die coating, alternative solution-based coating and printing processes that produce continuous or patterned films can be used. The multiple layers applied to base substrate 110 do not need to be formed using the same process.

As shown in Table 1, a typical thermal treatment process for Layer 1 and Layer 2 requires approximately 30 minutes for each layer using an oven. For Layer 1, the required treatment temperature is approximately 500° C. These treatment times and temperatures are not favorable for manufacturing and power consumption.

The present disclosure describes photo-thermal treatment processes that significantly reduce total process time, and therefore manufacturing costs, for forming OLED light extraction substrates and the like. The photo-thermal treatment processes disclosed herein can shorten the sintering duration to 10 minutes or less at temperatures of 150° C. These processes can be applied, for example, to make the light extraction substrates 100 discussed above.

One aspect comprises a first process for forming a light extraction substrate, the process comprising disposing a precursor material on a base substrate 110, and photo-thermally treating the precursor to form a porous photo-thermally treated light extraction layer. Some embodiments further comprise disposing a second layer on the first, photo-thermally treated light extraction layer. In some embodiments, the second layer comprises a planarizing layer, 130. In some embodiments, additional layers are disposed on the first and second layer. The additional layers may comprise one or more electrode layers along with one or more organic layers for light emission.

Another aspect comprises a process comprising disposing a two-layer precursor on the base substrate, where the two-layer precursor comprises a first layer adjacent the base substrate, the first layer comprising an inorganic oxide and an organic binder and a second layer adjacent the first layer comprising an inorganic polymer layer, then acting on the two-layer precursor to form a light extraction layer and a planarizing layer, wherein acting comprises photo-thermally treating at least one of the layer of the two-layer precursor.

In some embodiments, the precursor is composed of particles comprising an inorganic oxide, metal oxide, or metalloid oxide, and an organic binder. Inorganic oxide particles in the precursor may comprise one or more metal oxides, such as $SiO_2$, $TiO_2$, ZnO, $SnO_2$, or combinations thereof. The inorganic particles may be in the form of particles, such as nano- or microparticles. For example, the particles may have an average diameter along their longest axis of from 10 nm to 1 µm as measured using standard techniques (for example, laser diffraction, dynamic light scattering, or image analysis). For example, light extraction layer 120 can comprise $TiO_2$ (i.e. titania). In some embodiments, the $TiO_2$ is in the form of rutile, or in a tetragonal crystal symmetry. In some embodiments, light extraction layer 120 comprises a porous $TiO_2$ layer. For example, light extraction layer 120 can have pores with a diameter of 10 nm to 1000 nm. In some embodiments, light extraction layer 120 comprises rutile $TiO_2$, having an index of refraction of n~2.6.

The precursor further comprises an organic binder. The organic binder may comprise any known or unknown organic, optionally polymeric, binder material that works with the present system. Examples include polyethylene glycol, polyethylene oxide, polyvinyl alcohol, polyvinyl pyrrolidone, polyacrylic acid, etc. In some embodiments, the photo-thermal treatment activates, modifies or improves the adhesion characteristics of the organic binder.

The precursor can further comprise one or more solvents. Solvents that can be used include water, ethanol, methanol, etc. The photo-thermal treatment process can be used to remove some or all of the solvent. In some embodiments, a pre-photo-thermal treatment step is used to reduce or remove substantially all the solvent. In such embodiments, the photo-sintering step may further reduce solvent levels, or further dry the precursor.

The two-layer precursor comprises all aspects of the precursor above, and further comprises a second layer comprising pre-planarization layer. The two-layer precursor is coated onto the base substrate in a way that prevents the two layers from substantially mixing. The pre-planarization layer should have a thickness sufficient to smooth out any surface roughness from the first layer. In some embodiments, a thickness of the pre-planarization layer can range from 0.1 µm to 5 µm. In some embodiments, a thickness of the pre-planarization layer can range from 0.5 µm to 1 µm. In some embodiments, the thickness of the pre-planarization layer 130 can be 0.7 µm.

The pre-planarization layer can be formed from an organic material, an inorganic material, or a hybrid material of organic and inorganic materials. In some embodiments, the pre-planarization layer comprises multiple layers of the same or different materials. In some embodiments, a siloxane, for example, PDMS (polydimethylsiloxane) having a refractive index of n=1.3-1.5, may be used. In some embodiments, the pre-planarization layer can be formed from a metal oxide, optionally in a carrier, such as MgO, $Al_2O_3$, $ZrO_2$, $SnO_2$, ZnO, $SiO_2$ or $TiO_2$, or combinations thereof. In some embodiments, pre-planarization layer can have a composition as described in Korean Patent Application No. 2016-034791A, which is incorporated by reference herein in its entirety.

In some embodiments, the two-layer precursor comprises a thermally treated precursor that forms a light extraction layer, subsequently coated with a pre-planarization layer that is photo-thermally treated. In such embodiments, the photo-thermal treatment can be used to initiate or cause reaction of the pre-planarization layer to form the planarization layer. This can be through photo-reaction, photo-initiation, solvent removal or other light-based processes.

The precursor forms a porous light extraction layer, 120. In some embodiments, the porous light extraction layer is formed by photo-thermally treating the precursor. This light extraction layer has the properties of the light extraction layer listed herein—in some embodiments, light extraction layer 120 comprises an inorganic oxide, metal oxide, or metalloid oxide. In some embodiments, one or more metal oxides, such as $SiO_2$, $TiO_2$, ZnO, $SnO_2$, or combinations thereof can be used for light extraction layer 120. Other inorganic and/or organic materials can also be used. In some embodiments, light extraction layer 120 can have a composition as described in Korean Patent Application No. 2016-034791A, which is incorporated by reference herein in its entirety. The oxide material may be in the form of particles, such as nano- or microparticles. For example, the particles may have an average diameter along their longest axis of from 10 nm to 1 µm as measured using standard techniques (for example, laser diffraction, dynamic light scattering, or image analysis). For example, light extraction layer 120 can comprise $TiO_2$ (i.e. titania). In some embodiments, the $TiO_2$ is in the form of rutile, or in a tetragonal crystal symmetry. In some embodiments, light extraction layer 120 comprises a porous $TiO_2$ layer. For example, light extraction layer 120 can have pores with a diameter of 10 nm to 1000 nm. In some embodiments, light extraction layer 120 comprises rutile $TiO_2$, having an index of refraction of n~2.6.

A thickness of the light extraction layer 120 can range from 0.4 µm to 5 µm. In some embodiments, light extraction layer 120 can have a thickness of 0.5 µm to 2 µm. In some embodiments, light extraction layer 120 can have a thickness of 0.8-1.7 µm.

Some embodiments further comprise disposing a second layer on the first, photo-thermally treated light extraction layer. In some embodiments, the second layer comprises a pre-planarizing layer, which may optionally be photo-sintered to form a planarizing layer, 130. The pre-planarizing and planarizing layer in these embodiments have the properties described above.

After the first and optional second layer are disposed on the base substrate, one or more additional layers can be disposed to form an OLED device. The additional layers may comprise one or more electrode layers along with one or more organic layers for light emission.

The photo-thermal treatment methods described herein include technical aspects similar to those described in U.S. Pat. Appl. Publ. No. 2013/0043221 and U.S. Pat. Appl. Publ. No. 2015/0181714, both of which are incorporated by reference in their entireties. The methods generally use light in at least the UV range. In particular, the light should be in the range of 300-400 nm, but may generally be broader or narrower, reaching wavelengths of 180-1000 nm, or from 350-400 nm. In order to generate the high energies needed, the methods generally use pulsed light technologies. A flash lamp-type device can be used to generate the high energy pulses needed for the processes described herein. The photo-thermal treatment properties described herein are applicable to flash lamp-type devices, but may also be applicable to coherent or other light sources that generate high energies. The entire substrate does not need to be exposed to the photo-sintering energy, but the photo-sintering can be locally controlled so that only selected regions of the substrate are exposed.

The light source can pulse in a mode of from single shot, to burst (multiple shots in quick succession, then a time delay), or continuous (regular interval of pulses). Repetition rates for the pulses can be from 1 Hz to 1000 Hz, for example 1-100 Hz, 100-500 Hz, etc. Pulse durations can be from 1 µs to 100 ms, measured at ⅓ peak value. In some embodiments, the pulse duration is from 0.1 ms to 20 ms, 50-500 µs or 50-100 µs.

Pulse energies can be from 1-5000 J/pulse, 50-5000 J/pulse, 100-5000 J/pulse, 20-2000 J/pulse, 50-2000 J/pulse, 100-2000 J/pulse, 500-5000 J/pulse, 500-2000 J/pulse, 1-100 J/pulse, 1-200 J/pulse, 1-300 J/pulse, 1-500 J/pulse, 1-1000 J/pulse, 100-4000 J/pulse, or 100-3000 J/pulse. Total energy delivered to the material per pulse can be from 0.01-5 $J/cm^2$/pulse, 0.01-2 $J/cm^2$/pulse, 0.01-1 $J/cm^2$/pulse, 0.01-0.5 $J/cm^2$/pulse, 0.01-0.1 $J/cm^2$/pulse, 0.1-5 $J/cm^2$/pulse, 0.1-2 $J/cm^2$/pulse, 0.1-1 $J/cm^2$/pulse, 0.1-0.5 $J/cm^2$/pulse, 0.5-5 $J/cm^2$/pulse, 0.5-2 $J/cm^2$/pulse, 0.5-1 $J/cm^2$/pulse, or 1-5 $J/cm^2$/pulse.

In addition to the pulse duration and pulse energy, the total number of pulses impinging on a material is important. This can be measured by the total number of pulses or by the total energy delivered to the material. In some embodiments, the total energy delivered to the material is from 0.1 to 200 $J/cm^2$. In some embodiments, the total energy delivered to the material is from 0.1 to 200 $J/cm^2$, 0.1 to 100 $J/cm^2$, 0.1 to 50 $J/cm^2$, 0.1 to 25 $J/cm^2$, 0.1 to 10 $J/cm^2$, 1 to 200 $J/cm^2$, 1 to 100 $J/cm^2$, 1 to 50 $J/cm^2$, 1 to 25 $J/cm^2$, 1 to 10 $J/cm^2$, 2 to 200 $J/cm^2$, 2 to 100 $J/cm^2$, 2 to 50 $J/cm^2$, 2 to 25 $J/cm^2$, 2 to 10 $J/cm^2$, 5 to 200 $J/cm^2$, 5 to 100 $J/cm^2$, 5 to 50 $J/cm^2$, 5 to 25 $J/cm^2$, 5 to 10 $J/cm^2$, 10 to 200 $J/cm^2$, 10 to 100 $J/cm^2$, 10 to 50 $J/cm^2$, 10 to 25 $J/cm^2$, 25 to 200 $J/cm^2$, 25 to 100 $J/cm^2$, 25 to 50 $J/cm^2$, 50 to 200 $J/cm^2$, or 50 to 100 $J/cm^2$.

Figure 8:
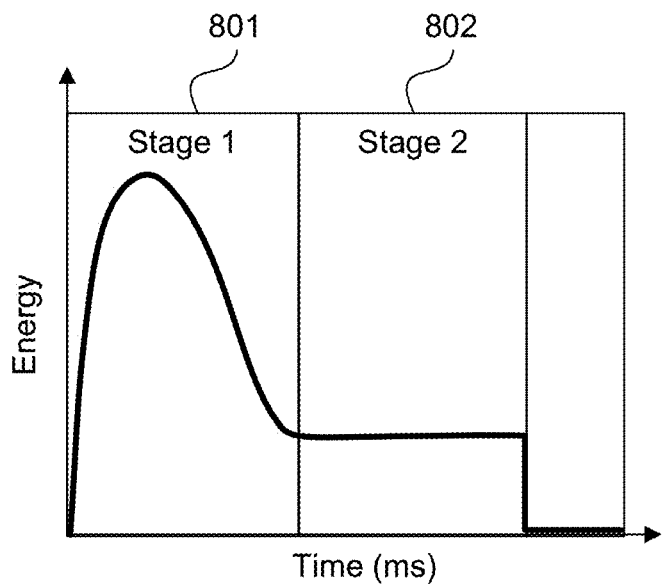
FIG. 8 illustrates a two-stage pulse, according to an embodiment.

In some embodiments, the photo-thermal treatment pulse comprises a pulse having a combination of two or more stages, such as shown in FIG. 8. A multi-stage pulse is particularly designed to provide optimal photo-thermal treatment of the light extraction layer without damaging or heating the substrate or light extraction layer to unacceptable levels. In some embodiments, the multi-stage pulse comprises a first stage that is higher in energy than the second stage. Alternatively, in some embodiments the second stage may be higher in energy than the first stage. In these embodiments, the first and second stages may comprise any number of pulse shapes, such as Gaussian, step-function, decaying-function, etc. In the case where there are greater than two stages, any permutation of energy variations may be acceptable in order to obtain the desired photo-sintered product using the embodied processes.

In multi-stage embodiments, the highest energy stage can have a duration from about 0.1 ms to 10 ms, 50-500 µs, or 50 to 100 µs. In the highest energy stage, the energy per pulse can be from 10 J/pulse to 5000 J/pulse, 100 J/pulse to 2500 J/pulse or any value in between. The number of pulses in the stage can be from 1 to 1000, 1 to 500, 1 to 100, or 1 to 40, or any value therein.

In multi-stage embodiments, any of the non-highest energy stages (the "lower energy stages") can have a duration from 0.1 ms to 10 ms, 1 ms to 10 ms, 1 ms to 5 ms, or 0.1 ms to 5 ms. In the highest energy stage, the energy per pulse can be from 10 J/pulse to 5000 J/pulse, 100 J/pulse to 2500 J/pulse or any value in between. The number of pulses in the stage can be from 1 to 1000, 1 to 500, 1 to 100, or 1 to 40, or any value therein. It is possible in some embodiments for the stages to have equivalent energies, hence making all stages lower energy stages.

In multi-stage embodiments, where the stages have different energy values, the ratio of the highest energy of the highest energy stage to the highest energy of lowest energy stage can be from 1.2 to 12, 1.5 to 10.5 to 10, or 2 to 8.

In some embodiments, the multi-stage pulse further comprises a starter pulse, comprising a short duration, high-energy light pulse prior to the multi-stage pulse. In embodiments comprising a starter pulse, the energy per pulse of the starter pulse is from 2 to 10× the energy per pulse of the highest pulse energy of the multi-stage pulse. In some embodiments, the pulse energy of the starter pulse is 20 J/pulse to 10,000 J/pulse, 100 J/pulse to 5000 J/pulse, 200 J/pulse to 2000 J/pulse, or any value in between. The starter pulse may have a duration of from 1 µs to 1 ms, 10 µs to 1 ms, 50 µs to 500 µs, 10 µs to 100 µs, or any value therein. Additionally, there may be a delay between the starter pulse and the multi-stage pulse of anywhere from 0.01 ms to 100 ms, 0.1 ms to 50 ms, 1 ms to 10 ms, 1 ms to 5 ms, or 0.1 ms to 5 ms.

EXAMPLES

Figure 2:
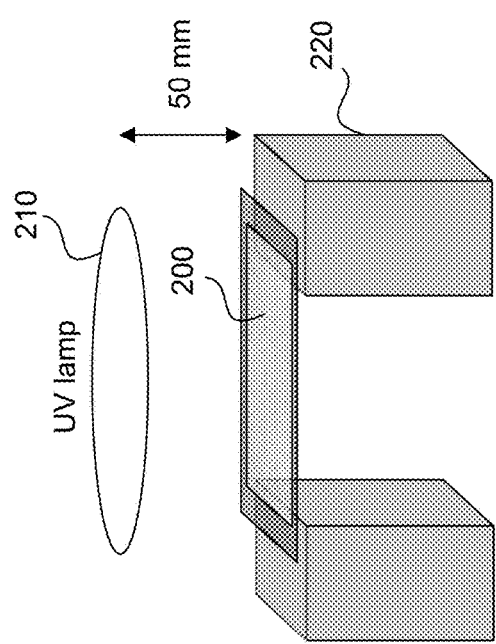
FIG. 2 illustrates a system for photo-thermal treatment, according to an embodiment.

Three examples are disclosed herein. These examples are not meant to be limiting to the disclosure. As shown in FIG. 2, samples 200 were placed 50 mm away from a light source/flash lamp 210 on a test stand 220 for photo-thermal treatment.

Other distances between the flash lamp 210 and sample 200, for example between 20-100 mm, can be used. In some embodiments, a xenon (Xe) flash lamp can be used.

Those skilled in the art will understand that higher current-densities can produce continuum emission. Spectral lines are less dominant, as light is produced across the spectrum, and usually peak or are "centered" on a certain wavelength. Optimum output-efficiency in the visual range is obtained at a density that favors "grey-body radiation," (i.e., an arc that produces mostly continuum emission, but is still mostly translucent to its own light). For xenon, grey-body radiation is centered near green light on the spectrum, and produces the right combination for white light. Greybody radiation is produced at current-densities above 2400 A/cm$^2$.

In contrast, current-densities that are very high, approaching 4000 A/cm$^2$, tend to favor "black-body radiation." As current-densities become even higher, visually, xenon's output spectrum settles on that of a black-body radiator with a color temperature of 9800 Kelvins. Except in cases where intense UV light is needed, black-body radiation is usually not desired because the arc becomes opaque, and much of the radiation from within the arc can be absorbed before reaching the surface, impairing output efficiency.

Figure 3:
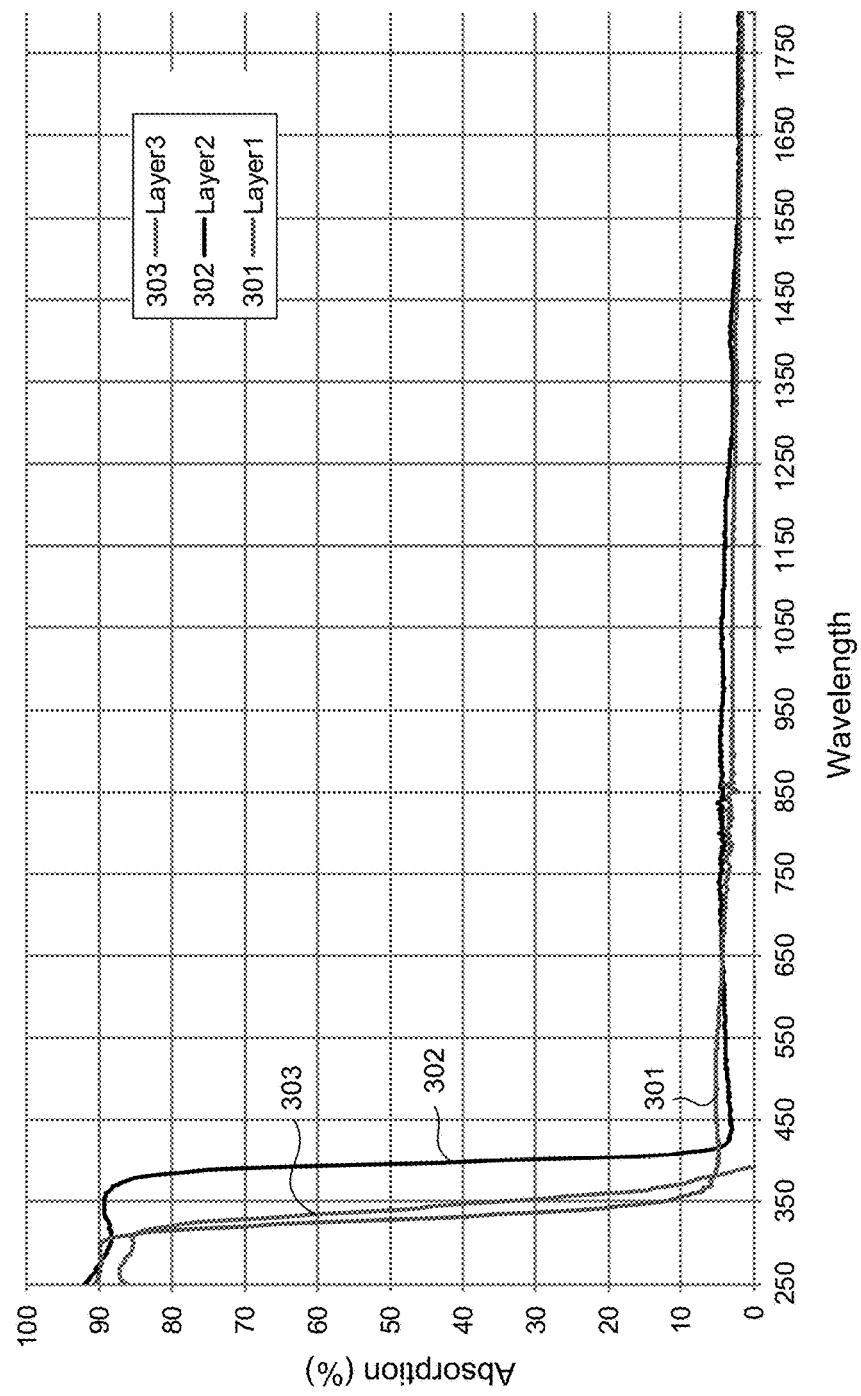
FIG. 3 illustrates absorption curves of layers of a light extraction substrate, according to an embodiment.
Figure 4A:
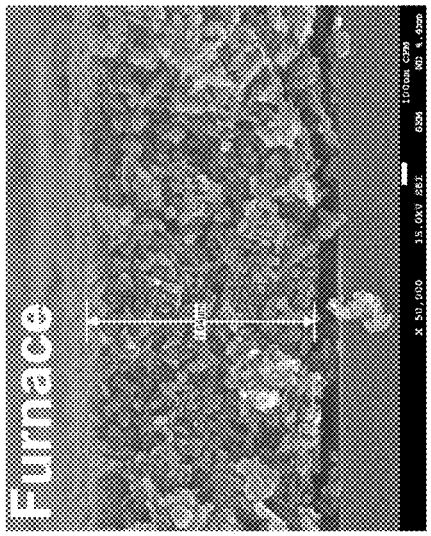
FIGS. 4(a)-(e) illustrate scanning electron microscope images of samples, according to embodiments.
Figure 4B:
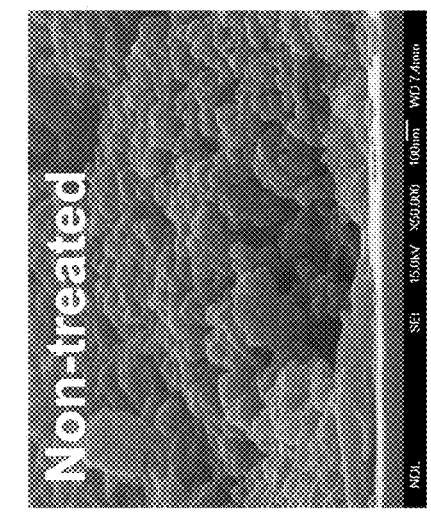
Figure 4C:
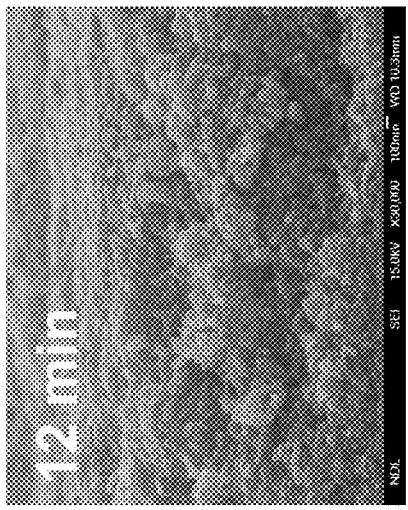
Figure 4D:
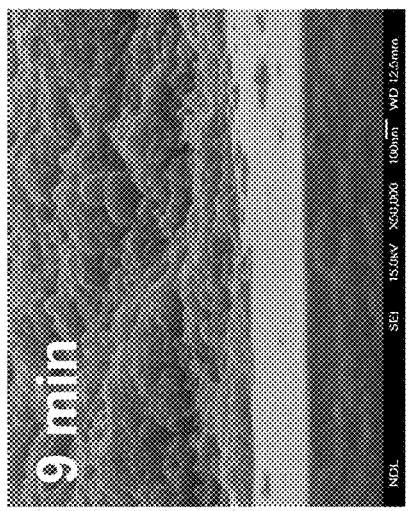
Figure 4E:
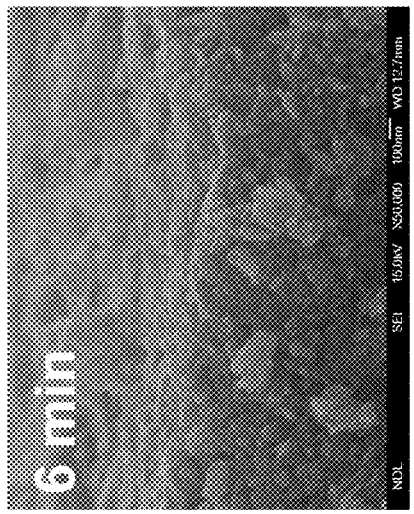

FIG. 3 shows the absorption curves 301, 302, and 303 for Layers 1, 2, and 3 of Table 1, respectively. FIG. 3 shows that nearly all absorption occurs within the UV range wavelength of less than 400 nm. By using a high energy exposure UV pulsed light to treat light extraction substrate layers, it was discovered that shorter sintering times (less than 10 minutes) can provide similar or better results than a traditional thermal sintering process, as confirmed by scanning electronic microscope (SEM) and thermal gravimetric analysis (TGA). In this way, the photonic sintering process can be used to control the material and structural properties of layers 120 and 130 such as porosity, internal stress, and optical and electrical properties, as examples.

Example 1

In a first example, a S-1000 flash lamp device manufactured by Xenon Corporation of Wilmington, Mass. was used for photo-sintering samples. The S-1000 device has adjustable exposure intensity ranging from 290-830 Joules/pulse with three exposure area options: 7.6 cm×7.8 cm, 1.9 cm×30 cm, and 30.5 cm×30.5 cm. In the first example, the flash lamp settings were: 3 Hz frequency, 500 μs pulse width (duration), and 3.8 kV for the maximum voltage. Durations for photo-thermal treatment were 1, 3, 6, 9, and 12 minutes.

UV-exposed samples were analyzed by SEM and TGA to confirm the treatment status. FIGS. 4(a)-(e) show the SEM images of a non-treated sample (i.e., not thermally or photo-sintered), a furnace treated sample, and samples exposed for 6, 9, and 12 minutes, respectively.

Figure 5:
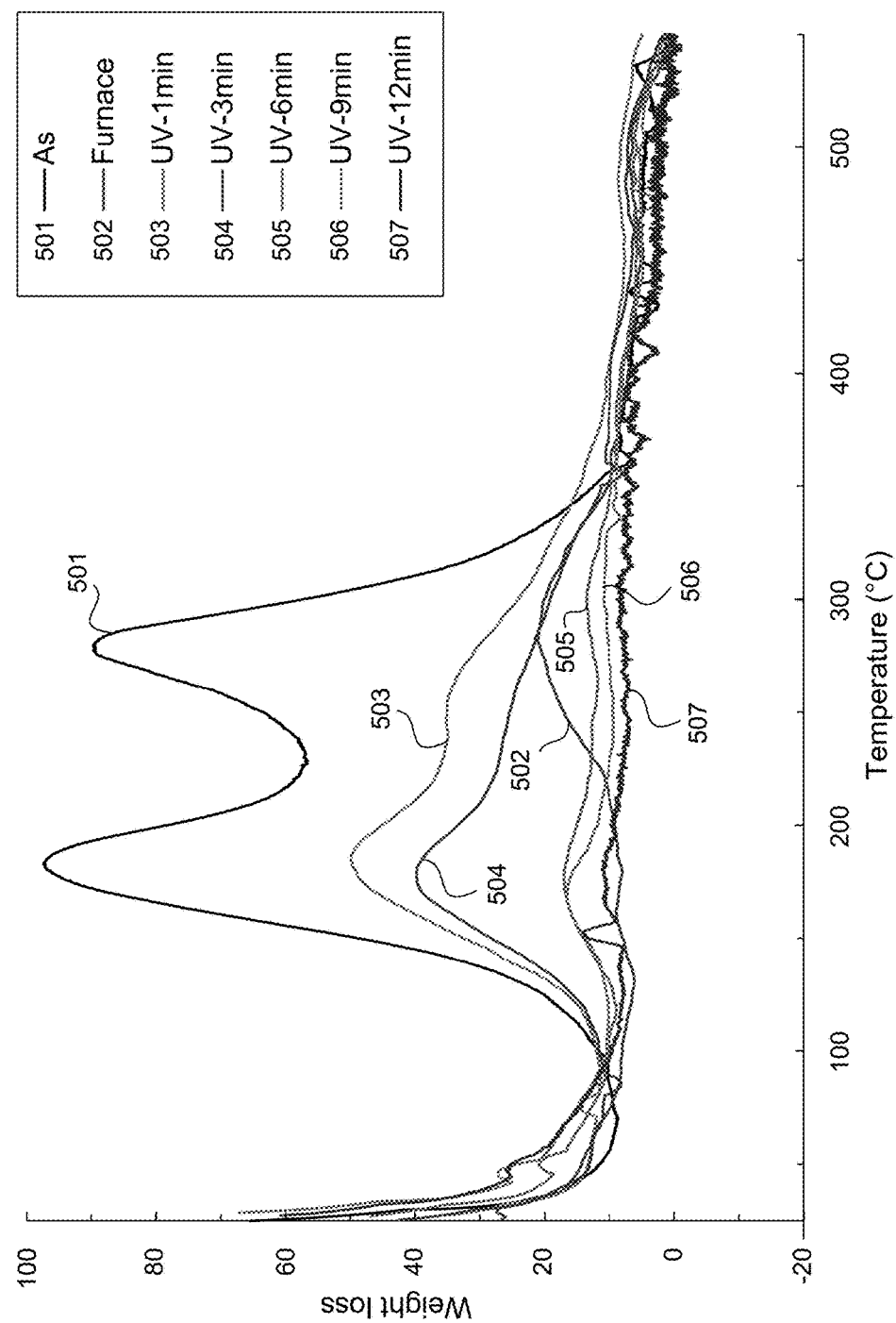
FIG. 5 illustrates thermal gravimetric analysis data for samples, according to embodiments.

FIG. 5 shows TGA data of the non-treated sample (As) 501, sample processed by furnace 502, and the samples treated with UV for different durations (1, 3, 6, 9, and 12 minutes)—represented by lines 503, 504, 505, 506, and 507, respectively. The non-treated sample 501 shows two major peaks at 200° C. and 300° C., which indicates that most of the organics are removed. Lower weight loss means less organic species left in the sample. In this example, the sample treated by furnace 502 is used as the control. Thus, FIG. 5 indicates that the samples exposed to the flash lamp for 6 minutes or longer—(i.e., 6 minutes (505), 9 minutes (506), and 12 minutes (507) have similar or smaller thermal weight loss as compared with the furnace-treated sample 502. The samples exposed to the flash lamp for 1 minute (503) and 3 minutes (504) show more weight loss when compared to the control sample. These results demonstrate the feasibility of using photo-thermal treatment to adhere light extraction substrates and achieve similar or better results as compared with furnace treatment, at significantly reduced treatment durations.

Example 2

In a second example, an S-2300 flash lamp device manufactured by Xenon Corporation of Wilmington, Mass. was used for photo-thermal treatment. Table 2 below indicates the conditions for each sample for Example 2. All samples were exposed to a pulse energy in the range of 100-3000 J/pulse. Pulse widths of 150 μs, 200 μs, 500 μs, and 3000 μs were used. Frequencies of 0.5 Hz, 0.6 Hz, 3 Hz, 4 Hz, and 10 Hz were used. The duration of exposure was either 4 minutes or 6 minutes. Table 2 also lists the haze and transmission values for each sample. Depending on the system used, the energy output per pulse can be in the range of 100 to 3000 J/pulse. The total energy received by the sample depends on frequency and duration of the pulse.

TABLE 2

| Sample ID | Haze/Tran. | Joules/pulse | Profile/width (μs) | Frequency (Hz) | Duration (min) | Δm |
| --- | --- | --- | --- | --- | --- | --- |
| #1 | 83/71 | 455 | 500 | 3 | 6 | 3.55% |
| #2 | 83/72 | 455 | 500 | 3 | 6 | 7.52% |
| #3 | 86/74 | 455 | 500 | 3 | 4 | 9.27% |
| #4 | 86/74 | 2730 | 3000 | 0.5 | 6 | 8.47% |
| #5 | 85/74 | 2730 | 3000 | 0.5 | 4 | 8.14% |
| #6 | 85/74 | 136 | 150 | 10 | 6 | 7.45% |
| #7 | 85/74 | 136 | 150 | 10 | 4 | 7.94% |
| #14 | 87/73 | 455 | 500 | 4 | 4 | 6.69% |
| #15 | 87/73 | 182 | 200 | 10 | 4 | 6.99% |
| #16 | 85/74 | 2730 | 3000 | 0.6 | 4 | 6.48% |

The percentage change in mass (Δm) in Table 2 indicates the amount of organics remaining after the photo-sintering process, measured by TGA, as wt % of the photo-sintered sample. The TGA was performed up to at least 500° C., which is expected to remove (and detect as a mass change) all organics remaining in the samples. The Δm values for every sample are less than 10 wt %, and many are less than 8 wt %, indicating that less than 10 (or 8) wt % of the photo-sintered sample is organic material. By comparison, the Δm of unsintered sample (As), for example shown in FIG. 5, is about 12.89%.

Figure 6:
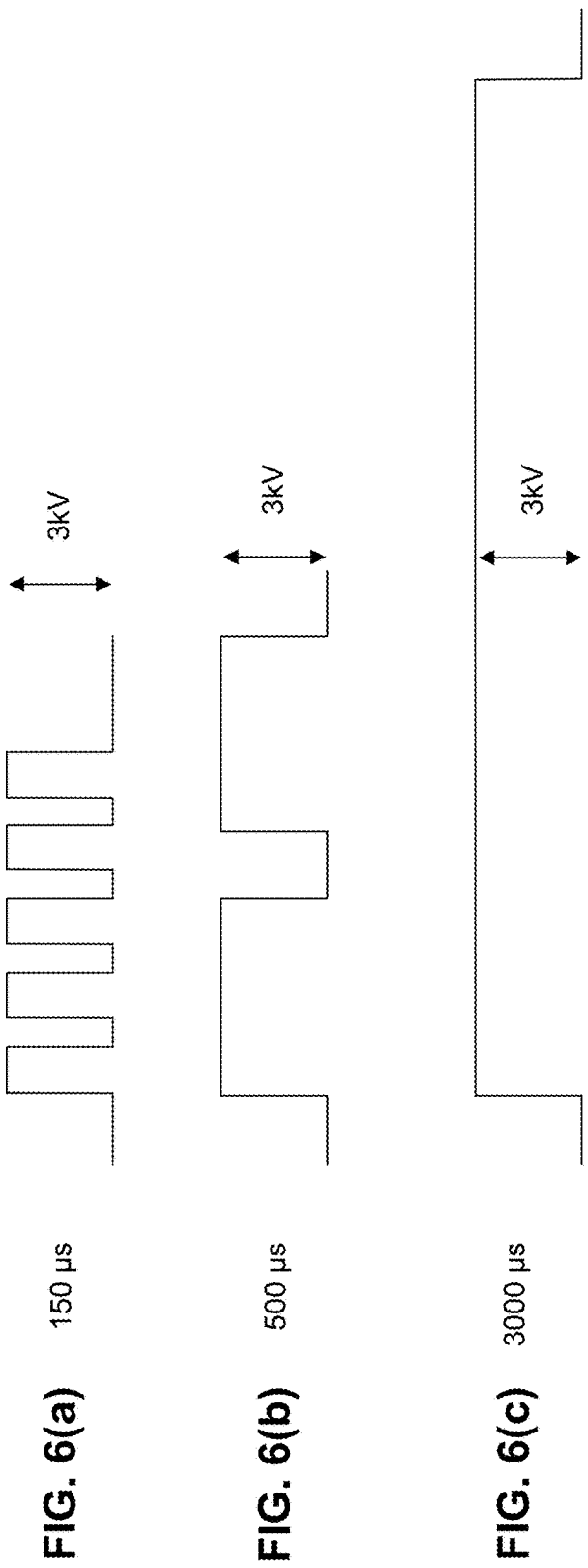
FIGS. 6(a)-(c) illustrate examples of pulse widths, according to embodiments.

FIGS. 6(a)-(c) illustrate examples of pulse widths used in Example 2. More specifically, FIGS. 6(a)-(c) illustrate pulse widths of 150 μs, 500 μs, and 3000 μs, respectively. As indicated in FIGS. 6(a)-(c), each pulse is in the range of 100-3000 J/pulse at an device voltage of 3000 V (3 kV). In some embodiments, there can be a pulse gap of 10,866 μs between pulses. The duration of the pulse gap can depend on the frequency of the pulses.

Figure 7:
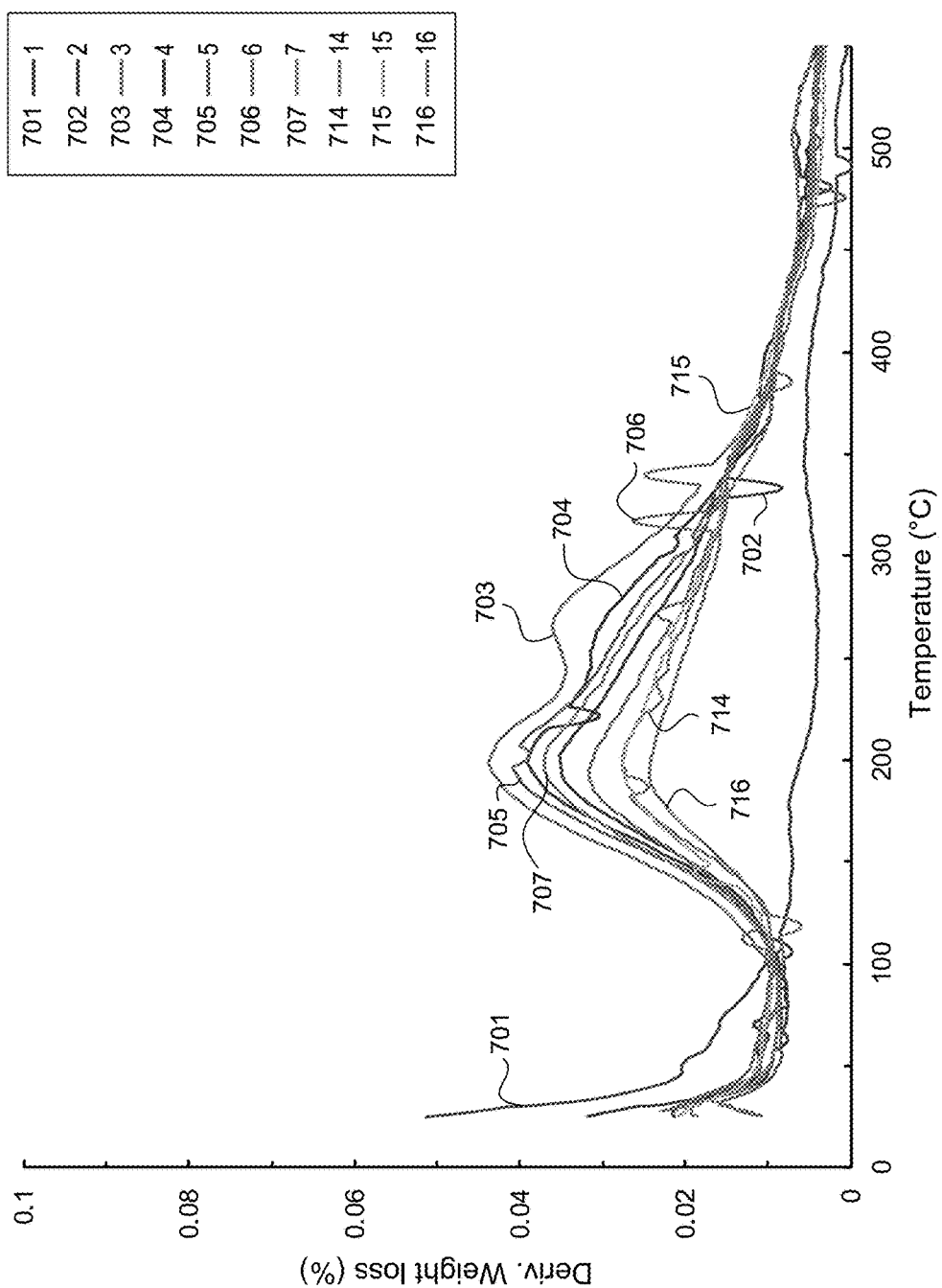
FIG. 7 illustrates thermal gravimetric analysis data for samples, according to embodiments.

FIG. 7 shows TGA data of the samples in Table 2 of Example 2. Samples 1, 2, 3, 4, 5, 6, 7, 14, 15, and 16 are represented by lines 701, 702, 703, 704, 705, 706, 707, 714, 715, and 716, respectively.

Example 3

In a third example, the two-stage function of the S-2300 flash lamp device manufactured by Xenon Corporation of Wilmington, Mass. was used for photo-thermally treatment of certain samples. This function prolongs the pulse tail. For other samples, a S-801 device manufactured by Xenon Corporation of Wilmington, Mass. was used for photo-thermal treatment. The S-801 device is able to achieve higher frequency.

FIG. 8 illustrates a schematic of the two-stage pulse function of the flash lamp. As shown in FIG. 8, during a first stage 801, the output energy can increase during a first portion, reach a peak, and then decrease during a second portion. For example, the output voltage can increase to 100-3000 J/pulse and then decrease during the second portion. During a second stage 802, the output voltage can remain constant at the end of the first stage. At the completion of the second stage 802, the pulse can end and output energy can drop to zero. In some embodiments, the duration of the first stage 801 can be 200 μs. In some embodiments, the duration of the second stage 802 can be 2000 μs. In some embodiments, there can be a pulse gap of 10,866 μs between pulses.

Table 3 below indicates the test conditions for each sample in Example 3. All samples treated with the S-2300 device were exposed to a pulse having an amplitude of 100-3000 J/pulse. Pulse widths of 150 μs and 200 μs were used with the S-2300 device. Pulse widths of 34 μs and 168 μs were used with the S-801 device. A frequency of 10 Hz was used with the S-2300 device. Frequencies of 15 Hz and 100 Hz were used with the S-801 device. The duration of exposure was either 1 minute, 2 minutes, 3 minutes, or 4 minutes for each sample. Table 3 also lists the haze and transmission values for each sample.

Figure 9A:
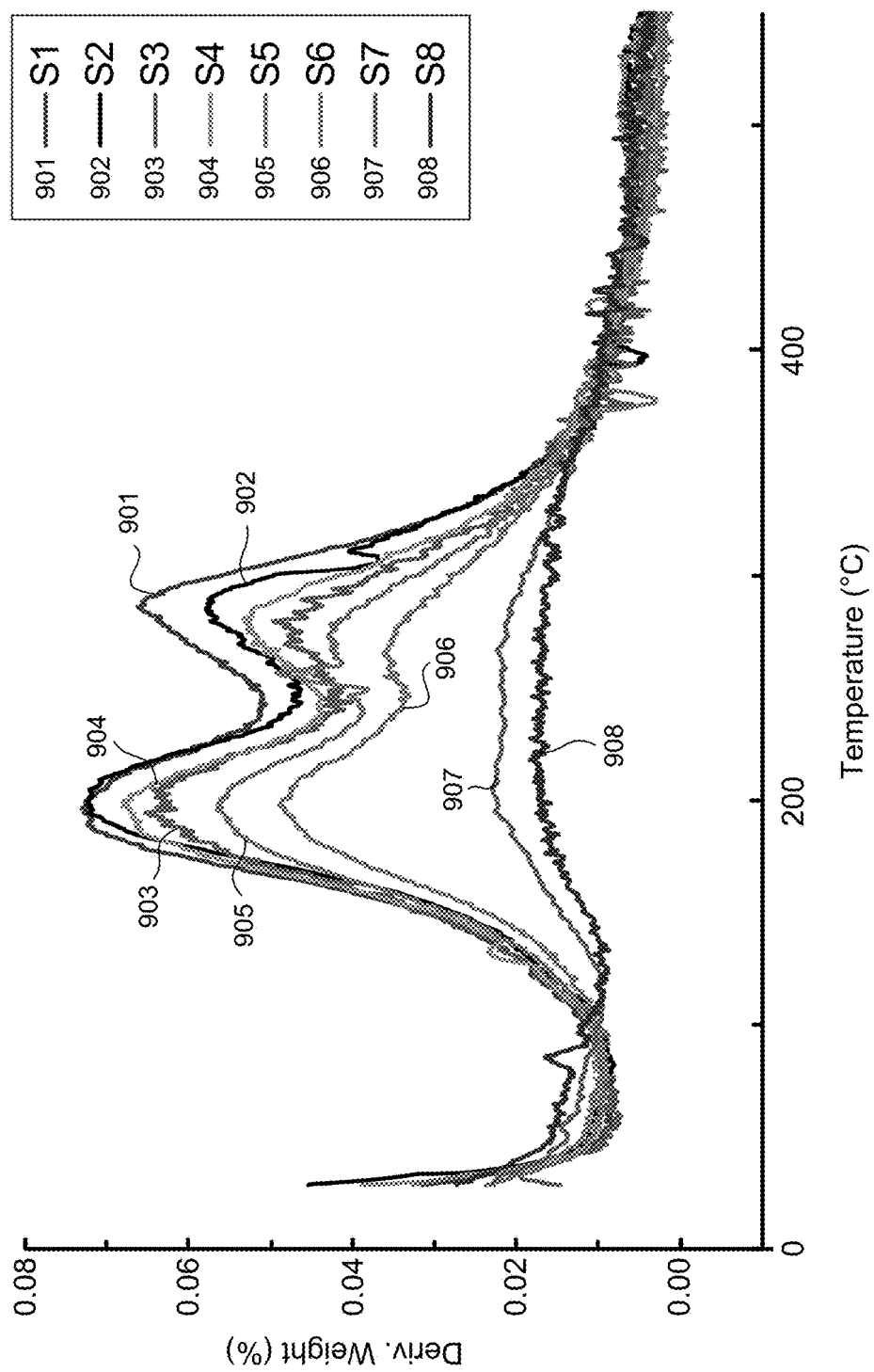
FIGS. 9(a)-(b) illustrate thermal gravimetric analysis data for samples, according to embodiments.
Figure 9B:
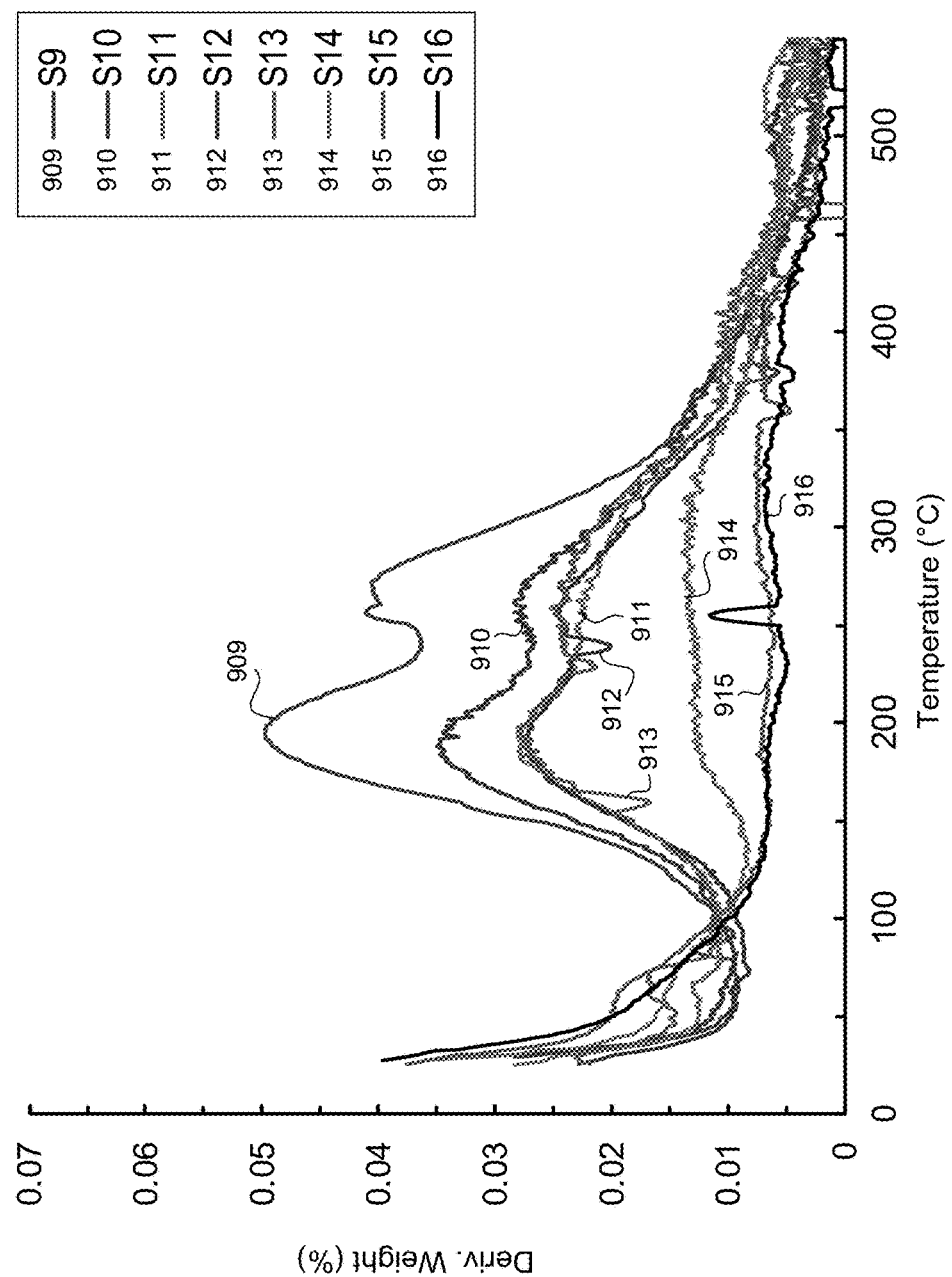

9(a) by lines 901, 902, 903, 904, 905, 906, 907, and 908, respectively. Samples S9, S10, S11, S12, S13, S14, S15, and S16 are represented in FIG. 9(b) by lines 909, 910, 911, 912, 913, 914, 915, and 916, respectively. FIG. 9(a) shows that the two-stage pulse with prolonged pulse tail—e.g., samples S7 (907) and S8 (908)—significantly enhances the photo-thermal treatment performance. Importantly, the exposure duration for these samples was only 1 minute.

Figure 10:
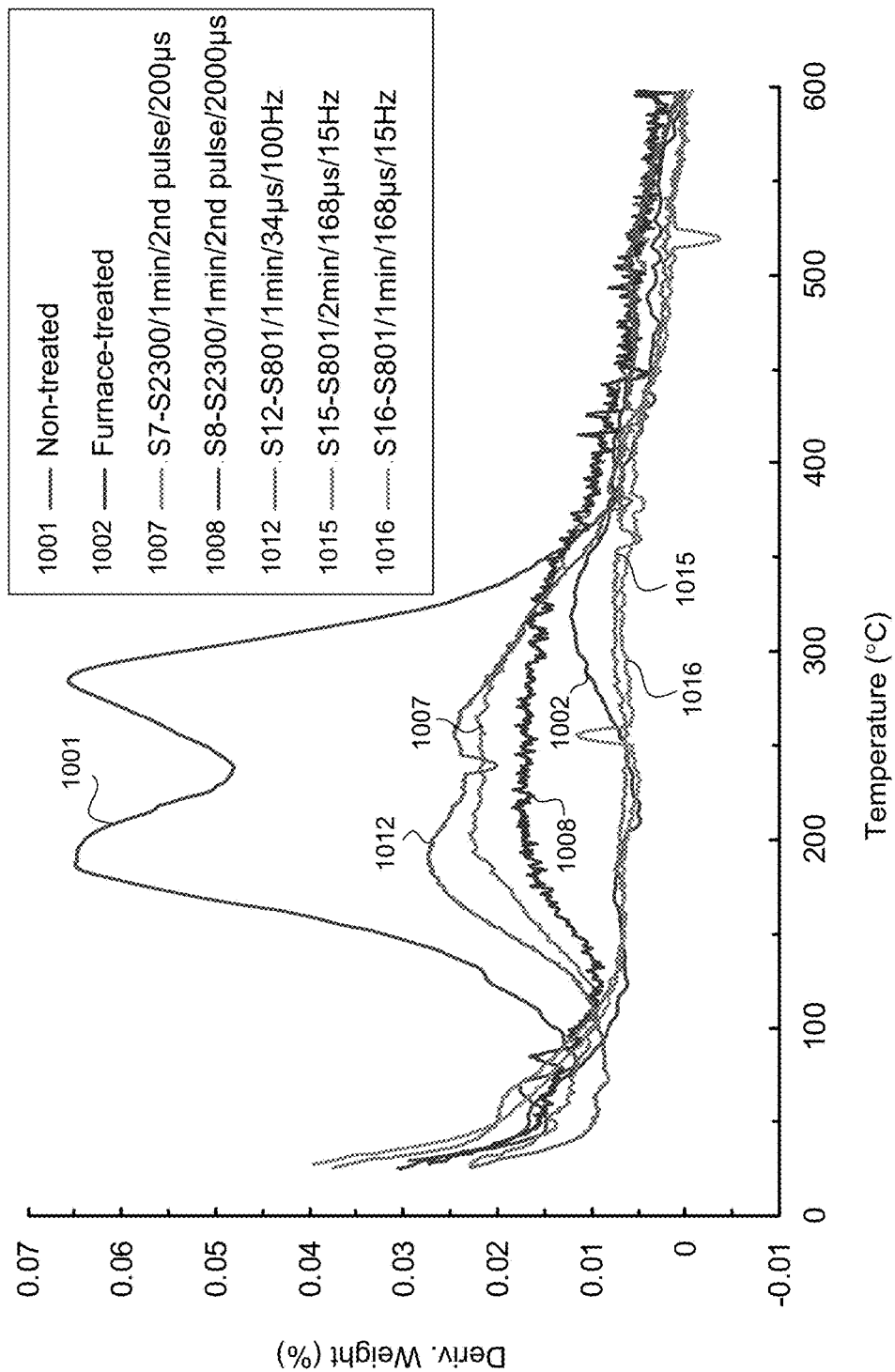
FIG. 10 illustrates thermal gravimetric analysis data for samples, according to embodiments.

FIG. 10 compares five samples from Example 3—S7, S8, S12, S15, and S16, represented by lines 1007, 1008, 1012, and 1015, respectively, with a non-treated sample 1001 and a furnace treated sample 1002. FIG. 10 shows that the S16 sample (1016), which was exposed using the S-801 (231 J/pulse in this case, 168 μs pulse width, 15 Hz frequency), has sintering results similar to the furnace treated sample. Importantly, the S16 sample (1016) achieves these results in only 1 minute, whereas the furnace treated sample required thermal sintering for 30 minutes.

Example Processes

Figure 11:
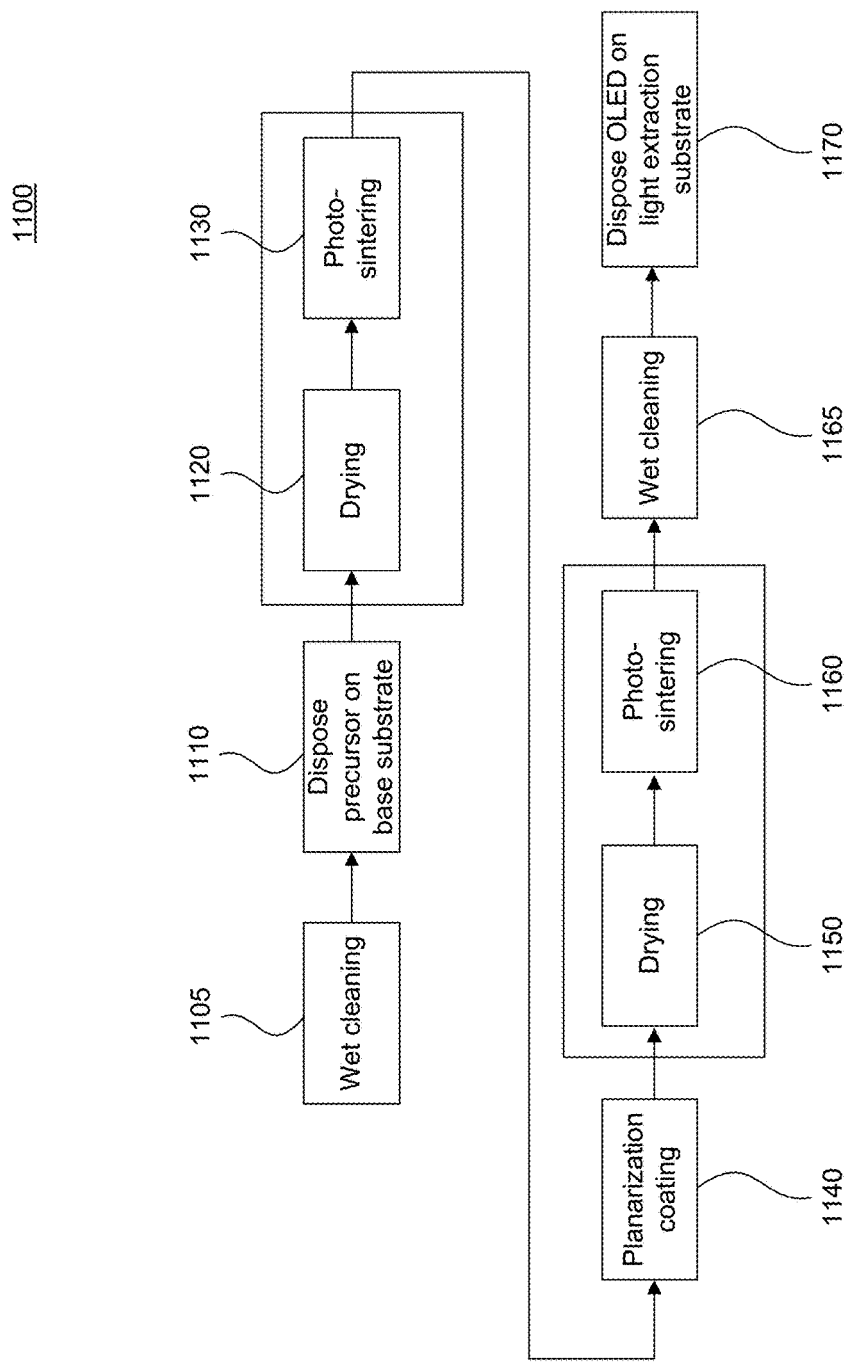
FIG. 11 illustrates a flow chart for a process, according to an embodiment.

FIG. 11 illustrates an example process 1100 for making the light extraction substrates 100 disclosed herein. In the embodiment shown in FIG. 11, at Step 1110 the precursor for light extraction layer 120 can be disposed onto base substrate 110. The precursor and base substrate 110 may be, for example, spray coated onto base substrate 110, or disposed by slot-die coating or spin coating processes, or any other suitable method of forming a coating. At Step 1120, the precursor can be dried. In some embodiments, the precursor can be vacuum dried for 30 seconds at 150° C. Drying at elevated temperature can also occur without a vacuum.

At Step 1130, the precursor and base substrate 110 can be photo-thermally treated to form the light extraction layer 120. In some embodiments, the duration of the photo-thermal treatment can be less than 10 minutes. In some embodiments, the duration of the photo-thermal treatment can be 1 minute to 4 minutes. In some embodiments, the duration of the photo-thermal treatment can be 1 minute.

TABLE 3

| Sample ID | Haze/Tran. | Pulse/amp (J/pulse) | Profile/width (μs) | Freq. (Hz) | Dur. (min) | Device |
|---|---|---|---|---|---|---|
| #S1 | 70 | 136 | 150 | 10 | 3 | S-2300 |
| #S2 | 71 | 136 | 150 | 10 | 2 | S-2300 |
| #S3 | 74 | 136 | 150 | 10 | 1 | S-2300 |
| #S4 | 70 | 182 | 200 | 10 | 3 | S-2300 |
| #S5 | 70 | 182 | 200 | 10 | 2 | S-2300 |
| #S6 | 72 | 182 | 200 | 10 | 1 | S-2300 |
| #S7 | 75 | 182 | 200 | 10 | 1 | S-2300 ($2^{nd}$ pulse: 2000 V, 200 μs) |
| #S8 | 71 | 182 | 200 | 10 | 1 | S-2300 ($2^{nd}$ pulse: 2000 V, 2000 μs) |
| #S9 | 72 | 19 | 34 | 100 | 4 | S-801 |
| #S10 | 71 | 19 | 34 | 100 | 3 | S-801 |
| #S11 | 71 | 19 | 34 | 100 | 2 | S-801 |
| #S12 | 72 | 19 | 34 | 100 | 1 | S-801 |
| #S13 | 74 | 231 | 168 | 15 | 4 | S-801 |
| #S14 | 69 | 231 | 168 | 15 | 3 | S-801 |
| #S15 | 71 | 231 | 168 | 15 | 2 | S-801 |
| #S16 | 70 | 231 | 168 | 15 | 1 | S-801 |

FIGS. 9(a)-(b) show TGA data of the samples in Table 3 of Example 3. FIG. 9(a) shows TGA data for samples exposed using the S-2300 device and FIG. 9(b) shows TGA data for samples exposed using the S-801 device. Samples S1, S2, S3, S4, S5, S6, S7, and S8 are represented in FIG.

In some embodiments, the photo-thermal treatment can include exposing the precursor to a flash lamp (e.g. a Xe flash lamp) that is energized in pulses. In some embodiments, each pulse can have a width of 150 μs to 500 μs. As described above, in some embodiments, the pulses can have a first stage, where an energy output from the flash lamp increases during a first portion of the first stage and decreases during a second portion of the first stage, and a second stage, where the energy output from the flash lamp is constant. The photo-sintering at Step 1130 can have any of the characteristics (e.g., duration, pulse width, frequency, and amplitude) described herein, for example, as described in Examples 1-3.

At Step 1140, a planarization layer 130 can be disposed onto the light extraction layer 120. At Step 1150, the planarization layer 130 can be dried. In some embodiments, the planarization layer 130 can be vacuum dried for 30 seconds at 120° C. Drying at elevated temperature can also occur without a vacuum.

At Step 1160, the planarization layer 130 can be photo-thermally treated. The photo-thermal treatment at Step 1160 may have any of the characteristics (e.g., duration, pulse width, frequency, and amplitude) described herein, for example, as described in Examples 1-3.

One of skill in the art would understand that some embodiments may not include certain steps and that some embodiments may include additional steps. For example, the base substrate 110 may undergo wet cleaning (Step 1105) before Step 1110 and the light extraction substrate 100 may undergo wet cleaning (Step 1165) after Step 1160.

Furthermore, while FIG. 11 shows a process that includes light extraction layer 120 and planarization layer 130, additional layers can also be included. For example, a second light extraction layer can be formed by the same process. In some embodiments, more than one layer can be disposed on base substrate 110 prior to photo-thermal treatment. For example, both the light extraction layer 120 and planarization layer can be disposed on base substrate 110, one on top of the other, prior to photo-thermal treatment. Accordingly, more than one layer can be photo-thermally treated at the same time. As an alternative example, layers 120 and 130 can both be applied to base substrate 110 and then undergo sequential treatment processes depending on the different material absorptions and photo-thermal treatment exposure configuration. Even though they are stacked, layer 120 can be treated before 130 or layer 130 can be treated before 120. Also, completion of photo-thermal treatment steps can occur after additional layers have been deposited or patterned such as ITO. The photo-thermal treatment process in this case can additionally be used to anneal the ITO layer. The photo-thermal treatment exposure can be combined with a thermal heating step in which case the photonic effects are in addition to any effects created by the thermal baseline process. The photo-thermal treatment process can occur when the substrate 110 and layers 120 and/or 130 are in a flat (horizontal or vertical or angled) state or when curved. The photo-thermal treatment exposure of the multiple layers can occur using different exposure lamps with different operating conditions with some located above the substrate and some located below, exposing through the substrate. In this case, the optical transparency of the base substrate 110 is an advantage. Also, the photo-thermal treatment exposure can be used to create patterned structures that include horizontal patterning or gradients of the layers 120 and/or 130 as well as creating vertical gradients of composition, porosity, or other properties in the films.

In some embodiments, at Step 1170, an OLED 170 may be disposed adjacent to the light extraction substrate 100. In some embodiments, the OLED 170 with light extraction substrate 100 may be included in a device such as portable information devices, cameras, watches, office equipment, information display windows of vehicles, televisions (TVs), display devices, illumination devices, and other electronic devices.

While various embodiments have been described herein, they have been presented by way of example only, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various needs as would be appreciated by one of skill in the art.

It is to be understood that the phraseology or terminology used herein is for the purpose of description and not of limitation. The breadth and scope of the present disclosure should not be limited by any of the above-described exemplary embodiments, but should be defined only in accordance with the following claims and their equivalents.

What is claimed is:

1. A process for forming an article for improved light extraction, the process comprising:
   providing a base substrate;
   disposing a precursor on the base substrate, the precursor comprising:
   particles of a first material comprising an inorganic oxide and having:
   an average diameter of from 10 nm to 1 μm; and
   an organic binder; and
   photo-thermally treating the precursor to form a porous photo-thermally treated light extraction layer having an average pore diameter from 10 nm to 1000 nm,
   wherein the photo-thermally treating comprises exposing the precursor to a radiation source emitting radiation in at least the range from 300 to 400 nm and the porous photo-thermally treated light extraction layer improves the light output of the article by a factor of 1.7× or greater.

2. The process of claim 1, wherein the process further comprises coating the photo-thermally treated light extraction layer with a second layer comprising an inorganic polymer and disposing an organic light emitting diode adjacent to the inorganic polymer.

3. The process of claim 2, further comprising disposing an organic light emitting diode layer adjacent to the light extraction layer.

4. The process of claim 1, wherein the radiation source comprises a pulsed radiation source having a pulse width of from 1 μs to 100 ms measured at ⅓ peak value.

5. The process of claim 4, wherein pulses from the pulsed radiation source have an energy per pulse of from 1 to 5000 J.

6. The process of claim 4, wherein pulses from the pulsed radiation source have an energy per pulse delivered to the material of from 0.01 to 1 $J/cm^2$/pulse.

7. The process of claim 4, wherein the total energy delivered to the material is from 0.1 to 100 $J/cm^2$.

8. The process of claim 4, wherein pulses from the pulsed radiation source comprise at least two different stages, a first stage comprising an initial part of the pulse and a second stage, comprising a subsequent part of the pulse, wherein each stage comprises a pulse energy and pulse duration.

9. The process of claim 8, wherein the first stage has an energy/pulse of 100-5000 J/pulse and a duration from 0.1 ms to 10 ms and the second stage has an energy/pulse of 100-5000 J/pulse and a duration from 0.1 ms to 10 ms.

10. The process of claim 8, wherein the first stage has a duration of from 100 μs to 300 μs and the second stage has a duration of from 1000 μs to 3000 μs.

11. The process of claim 8, wherein the first stage has a total energy delivered to the material from 0.1 to 100 J/cm².

12. The process of claim 11, wherein the first stage has a peak energy that is 1.5 to 10× higher than the peak energy of the second stage.

13. The process of claim 8, wherein the ratio of total energy delivered to the material in the first stage/second stage is from 1-4.

14. The process of claim 8, wherein the process further comprises a starter pulse that has an energy/pulse of 2-10× the energy/pulse value of the first stage pulse.

15. The process of claim 1, wherein the overall duration of the photo-thermally treating is from 20 seconds to 10 minutes.

16. The process of claim 1, wherein a maximum temperature during the photo-thermally treating is 150° C. or less.

17. The process of claim 1, wherein the particles of the first material comprise TiO₂.

18. The process of claim 1, wherein the base substrate comprises a continuous, flexible sheet, and the process comprises a roll-to-roll process.

19. The process of claim 18, wherein the continuous, flexible sheet comprises a glass sheet with a thickness of 100 μm or less.

20. A process for forming an article for improved light extraction, the process comprising:
providing a base substrate;
disposing a two-layer precursor on the base substrate, the two-layer precursor comprising:
a first layer adjacent to the base substrate, the first layer comprising:
an inorganic oxide having an average diameter from 10 nm to 1 μm, and
an organic binder; and
a second layer adjacent to the first layer, the second layer comprising:
an inorganic polymer smoothing layer;
wherein the first layer and second layer are substantially unmixed; and
acting on the two-layer precursor to form a light extraction layer having an average pore diameter from 10 nm to 1000 nm; wherein acting comprises photo-thermally treating at least one layer of the two-layer precursor; and
wherein:
the photo-thermally treating comprises exposing the precursor to a radiation source emitting radiation in at least the range from 300 to 400 nm, and the porous photo-thermally treated light extraction layer improves the light output of the article by a factor of 1.7× or greater.

21. The process of claim 20, further comprising disposing a light generation layer adjacent to the second layer, wherein disposing the light generation layer adjacent to the photo-thermally treated light extraction layer comprises fabricating the organic light emitting diode on the planarization layer.

22. The process of claim 20, wherein the radiation source comprises a pulsed radiation source having a pulse width of from 1 μs to 100 ms measured at ⅓ peak value.

23. The process of claim 22, wherein pulses from the pulsed radiation source have an energy per pulse of from 1 to 5000 J.

24. The process of claim 23, wherein pulses from the pulsed radiation source have an energy per pulse delivered to the material of from 0.01 to 1 J/cm²/pulse.

25. The process of claim 22, wherein the total energy delivered to the material is from 0.1 to 100 J/cm².

26. The process of claim 22, wherein pulses from the pulsed radiation source comprise at least two different stages, a first stage comprising an initial part of the pulse and a second stage, comprising a subsequent part of the pulse, wherein each stage comprises a pulse energy and pulse duration.

27. The process of claim 26, wherein the first stage has an energy/pulse of 100-5000 J/pulse and a duration from 0.1 ms to 10 ms and the second stage has an energy/pulse of 100-5000 J/pulse and a duration from 0.1 ms to 10 ms.

28. The process of claim 26, wherein the first stage has a duration of from 100 μs to 300 μs and the second stage has a duration of from 1000 μs to 3000 μs.

29. The process of claim 26, wherein the first stage has a total energy delivered to the material from 0.1 to 100 J/cm².

30. The process of claim 29, wherein the first stage has a peak energy that is 1.5 to 10× higher than the peak energy of the second stage.

31. The process of claim 26, wherein the ratio of total energy delivered to the material in the first stage/second stage is from 1-4.

32. The process of claim 26, wherein the process further comprises a starter pulse that has an energy/pulse of 2-10× the energy/pulse value of the first stage pulse.

33. The process of claim 20, wherein the overall duration of the photo-thermally treating is from 20 seconds to 10 minutes.

34. The process of claim 20, wherein a maximum temperature during the photo-thermally treating is 150° C. or less.

35. The process of claim 20, wherein the particles of the inorganic oxide comprise TiO₂.

* * * * *